United States Patent [19]
Scherer et al.

[11] Patent Number: 5,844,939
[45] Date of Patent: Dec. 1, 1998

[54] LOW-COST PHASELOCKED LOCAL OSCILLATOR FOR MILLIMETER WAVE TRANSCEIVERS

[75] Inventors: Dieter Scherer; Thomas L. Grisell, both of Palo Alto, Calif.

[73] Assignee: Hewlett-Packard Company, Palo Alto, Calif.

[21] Appl. No.: 800,311

[22] Filed: Feb. 14, 1997

[51] Int. Cl.$^6$ .............................. H04B 1/38; H04B 1/40; H04B 1/06

[52] U.S. Cl. .............................. 375/219; 455/76; 455/84; 455/73; 455/260

[58] Field of Search ................................. 375/219, 221; 455/575, 550, 84, 73, 76, 86, 260

[56] References Cited

U.S. PATENT DOCUMENTS

| | | | |
|---|---|---|---|
| 4,489,413 | 12/1984 | Richmond et al. | 455/86 |
| 4,932,070 | 6/1990 | Waters et al. | 455/10 |
| 5,134,707 | 7/1992 | Sakashita et al. | 455/3.2 |
| 5,280,644 | 1/1994 | Vannatta et al. | 455/265 |
| 5,790,959 | 8/1998 | Scherer | 455/561 |
| 5,794,119 | 8/1998 | Evans et al. | 455/6.2 |

Primary Examiner—Chi H. Pham
Assistant Examiner—Khai Tran
Attorney, Agent, or Firm—Brian R. Short

[57] ABSTRACT

An LMDS system including a base station, subscriber units and subscriber modems. Transmission frequencies between the base station and the subscriber units are specified by the Federal Frequency Commission. Signal frequencies between the subscriber units and the subscriber modems are specified by industry standards. The subscriber units couple and frequency translate modulated signals between the base stations and the subscriber modems. The frequency translation requires an intermediate transmit oscillator and a local oscillator. The intermediate transmit oscillator, however, can also be used to frequency translate a local oscillator signal within each subscriber unit down to a lower frequency which allows a low cost phase locked loop chip to be used to phase lock the local oscillator in each subscriber unit to a reference source. A pilot tone can be coupled onto modulated signals transmitted from the base station to the subscriber units. The pilot tone can be summed into the local oscillator phase locked loop within each subscriber unit to reduce the effects of signal transmission on the phase noise of the modulated signals. Furthermore, dual pilot tones can be coupled onto the modulated signal transmitted from the base station to the subscriber units. The dual pilot tones can be used to generate a reference signal within each subscriber unit.

9 Claims, 6 Drawing Sheets

5,844,939

LOW-COST PHASELOCKED LOCAL OSCILLATOR FOR MILLIMETER WAVE TRANSCEIVERS

FIELD OF INVENTION

This invention relates to a transceiver within a subscriber unit of a Local Multipoint Distribution Service (LMDS) system. In particular, it relates to an apparatus and method of inexpensively phase locking a local oscillator within the subscriber unit transceiver to a stable low frequency reference oscillator.

BACKGROUND

Local Multipoint Distribution Service (LMDS) is a wireless information access system. Wireless information systems are often less expensive, and can be implemented more quickly, than wired systems because wireless system require less infrastructure.

An LMDS system comprises a microcellular configuration including a large number of cells wherein each cell ranges from about 0.5 $km^2$ to 2 $km^2$ in size. Each cell contains a basestation serving many subscriber units. A large number of subscriber units are required to support an LMDS system. The subscriber units are sold to consumers and must be simply and inexpensively manufactured while maintaining an acceptable level of performance.

FIG. 1 shows a base station transceiver 2 and a subscriber unit transceiver 4. Generally, the base station 2 includes a base local oscillator 6 which provides a base local oscillator signal to a first input of a first base mixer 8. A modulated transmit signal is coupled to a second input of the first base mixer 8. The first base mixer 8 mixes the modulated transmit signal with the base local oscillator signal, frequency upconverting the modulated transmit signal. The frequency upconverted modulated signal is transmitted to subscriber units through a first base antenna 10. The subscriber unit 4 receives the modulated signal from the base station 2 through a first subscriber antenna 12. The subscriber unit includes a subscriber local oscillator 14 which is coupled to a first subscriber mixer 16 for frequency downconverting the received modulated signal. The frequency downconverted modulated signal can be demodulated.

Modulated signals are also transmitted from the subscriber unit 4 to the base station 2. The subscriber unit local oscillator 14 is coupled to a second subscriber mixer 18 for frequency upconverting a subscriber modulated signal for transmission to the base station 2 through a second subscriber antenna 20. The base station 2 receives the subscriber modulated signal from the subscriber unit 4 through a second base antenna 22. The base local oscillator 6 is also coupled to a second base mixer 24 for frequency downconverting the received subscriber modulated signal. The frequency downconverted modulated signal can then be demodulated.

The subscriber unit 4 receives a high frequency (27.5–28.35 GHZ) digitally modulated signal from the base station 2. The subscriber unit frequency downconverts the received high frequency signal to an intermediate frequency (950–1800 MHZ) which a subscriber modem can demodulate.

The subscriber unit 4 also receives a low frequency (400–700 MHZ) digitally modulated signal from the subscriber modem. The subscriber unit 4 frequency upconverts the low frequency modulated signal to a transmission frequency (31–31.3 GHZ).

The integrity of the received and transmitted signals can be affected by frequency instabilities and phase noise of the local oscillator signals. The upconversion and downconversion of the modulated signals causes the noise and frequency instabilities of the local oscillator signals to be imposed upon the modulated signals. For optimal performance, the effects of the noise and frequency instability of the local oscillator signals must be minimized. Typically, the oscillator that generates the local oscillator signal is a dielectric resonance oscillator (DRO).

The frequency stability and phase noise of the local oscillators can be improved by phase locking the local oscillators to stable low frequency reference signals. Phase locking the local oscillators can be complex and expensive because the local oscillators must operate at a very high frequency.

Phase noise and frequency perturbations can also be imposed upon the modulated signals during transmission of the modulated signals between the base station and the subscriber unit. These perturbations can occur when the transmitted signals follow multiple transmissions paths having time varying lengths between the base station and the subscriber unit. The perturbations are exacerbated if the multiple paths include scattering of the transmitted signals by moving surfaces like the leaves of a tree.

It would be desirable to have a LMDS system in which the local oscillator within the system is phaselocked to a stable low frequency reference signal. It would also be desirable that the apparatus for phase locking the local oscillator to the reference signal be inexpensive and require a minimal number of electronic parts. Optimally, the reference signal could compensate for phase perturbations that occur during the transmission of modulated signals between the base station and the subscriber unit.

SUMMARY OF THE INVENTION

The present invention includes an inexpensive apparatus and method for phase locking a local oscillator within an LMDS subscriber unit to a stable low frequency reference signal. The LMDS system further includes an apparatus and method for compensating for phase perturbations imposed upon modulated signals transmitted between the base station and subscriber units within the LMDS system.

A first embodiment of this invention includes an LMDS transceiver. The transceiver includes a transceiver oscillator and a receiver mixer. The transceiver oscillator generates a transceiver drive signal. The receive mixer mixes a received modulated signal with a harmonic of the transceiver drive signal to generate an intermediate frequency received signal. A demodulator is connected to the transceiver for demodulating the intermediate received signal. The transceiver further includes an intermediate transmit oscillator, an intermediate transmit mixer and a final transmit mixer. The intermediate transmit oscillator generates an intermediate transmit oscillator signal. The intermediate transmit mixer mixes a transmit modulated signal with a harmonic of the intermediate transmit oscillator signal to generate an intermediate transmit signal. The final transmit mixer mixes the intermediate transmit signal with a harmonic of the transceiver drive signal to generate an output transmit signal. The intermediate transmit oscillator is phase locked to a stable low frequency reference signal generated by a reference source. To phase lock the transceiver oscillator to the stable low frequency reference signal, this embodiment further includes a transceiver drive mixer frequency that mixes the transceiver drive signal with a harmonic of the intermediate transmit oscillator signal to generate an intermediate phase detect signal. Finally, a phase locked loop chip receives the intermediate phase detect signal and the stable low frequency reference signal and phase locks the transceiver oscillator to the reference source. The intermediate transmit oscillator is required for acceptable frequency upconversion of the transmit modulated signal. Thereby, allowing adequate filtering of the transmit signal. This embodiment utilizes the intermediate transmit oscillator to frequency downconvert the transceiver oscillator. The frequency downconversion allows an inexpensive phase locked loop chip to be used to phase lock the transceiver oscillator.

A second embodiment of this invention is similar to the first embodiment, except the intermediate phase detect signal and the transceiver drive signal are generated differently than in the first embodiment. The transceiver oscillator generates a transceiver oscillator signal. The transceiver drive mixer mixes the transceiver oscillator signal with a harmonic of the intermediate transmit oscillator signal to generate a transceiver drive signal and an intermediate phase detect signal. Similar to the first embodiment, a phase locked loop chip receives the intermediate phase detect signal and the stable low frequency reference signal and phase locks the transceiver oscillator to the reference source.

A third embodiment of this invention is similar to the first embodiment. However, the transceiver drive signal is generated by mixing a harmonic of a first intermediate oscillator signal generated by the intermediate transmit oscillator with a harmonic of a second intermediate transmit oscillator signal generated by an intermediate frequency oscillator. Both the intermediate transmit oscillator and the intermediate frequency oscillator are phase locked to the stable low frequency reference signal. This embodiment does not require the transceiver oscillator or the phase locked loop chip.

A fourth embodiment of this invention includes an LMDS system. The LMDS system includes a base station transmitter and a subscriber unit. The base station transmitter includes circuitry for generating a modulated signal. The base station further includes a first reference oscillator generating a first reference signal and circuitry for coupling dual pilot tones onto the modulated signal wherein the dual pilot tones are each phase locked to the first reference signal and the frequency difference between the dual pilot tones is a multiple or a submultiple of the frequency of the first reference signal. The subscriber unit includes a local oscillator generating a local oscillator signal, and a mixer for mixing the local oscillator signal with the modulated signal generating an intermediate frequency modulated signal. A reference filter filters the intermediate frequency modulated signal, to generate an intermediate reference signal wherein the intermediate reference signal includes the dual pilot tones. The subscriber unit includes circuitry for generating a second reference signal by detecting the frequency difference between the dual pilot tones. A phase locked loop chip generates an error signal proportional to the phase difference between one of the pilot tones within the intermediate reference signal and the second reference signal, and tunes the frequency of the local oscillator to minimize the error signal.

DETAILED DESCRIPTION

Figure 1:
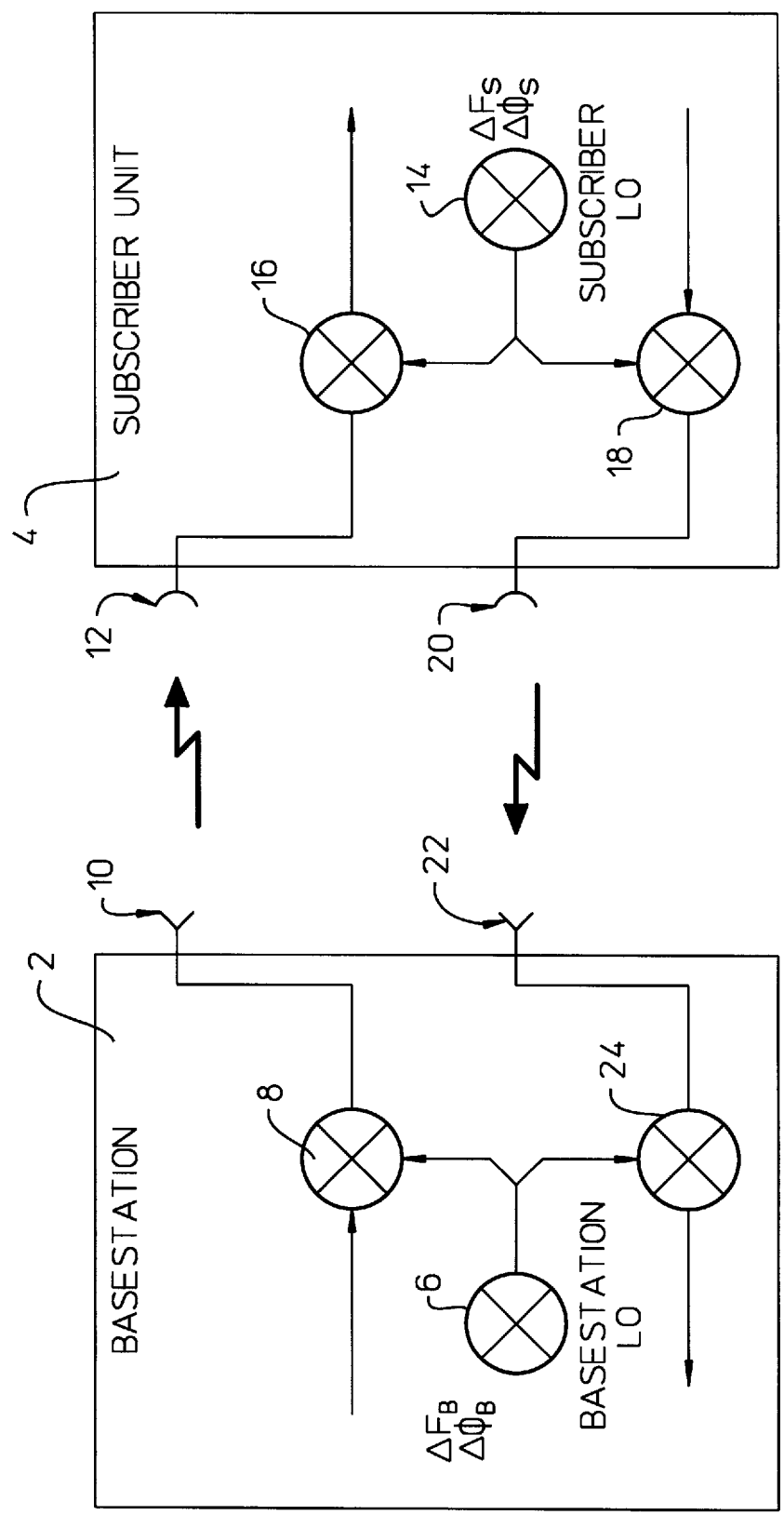
FIG. 1 is a block diagram of an LMDS system according to the prior art.

As shown in the drawings for purposes of illustration, the invention is embodied in a low cost LMDS transceiver which provides phase locking of a dielectric resonance oscillator (DRO) to a stable low frequency reference oscillator signal. The DRO is used as a local oscillator for frequency upconverting modulated signals to be transmitted and frequency downconverting received signals to be demodulated. The low frequency reference oscillator signal may be coupled onto a modulated signal transmitted from an LMDS base station to an LMDS subscriber unit as a single or dual pilot tone.

Figure 2:
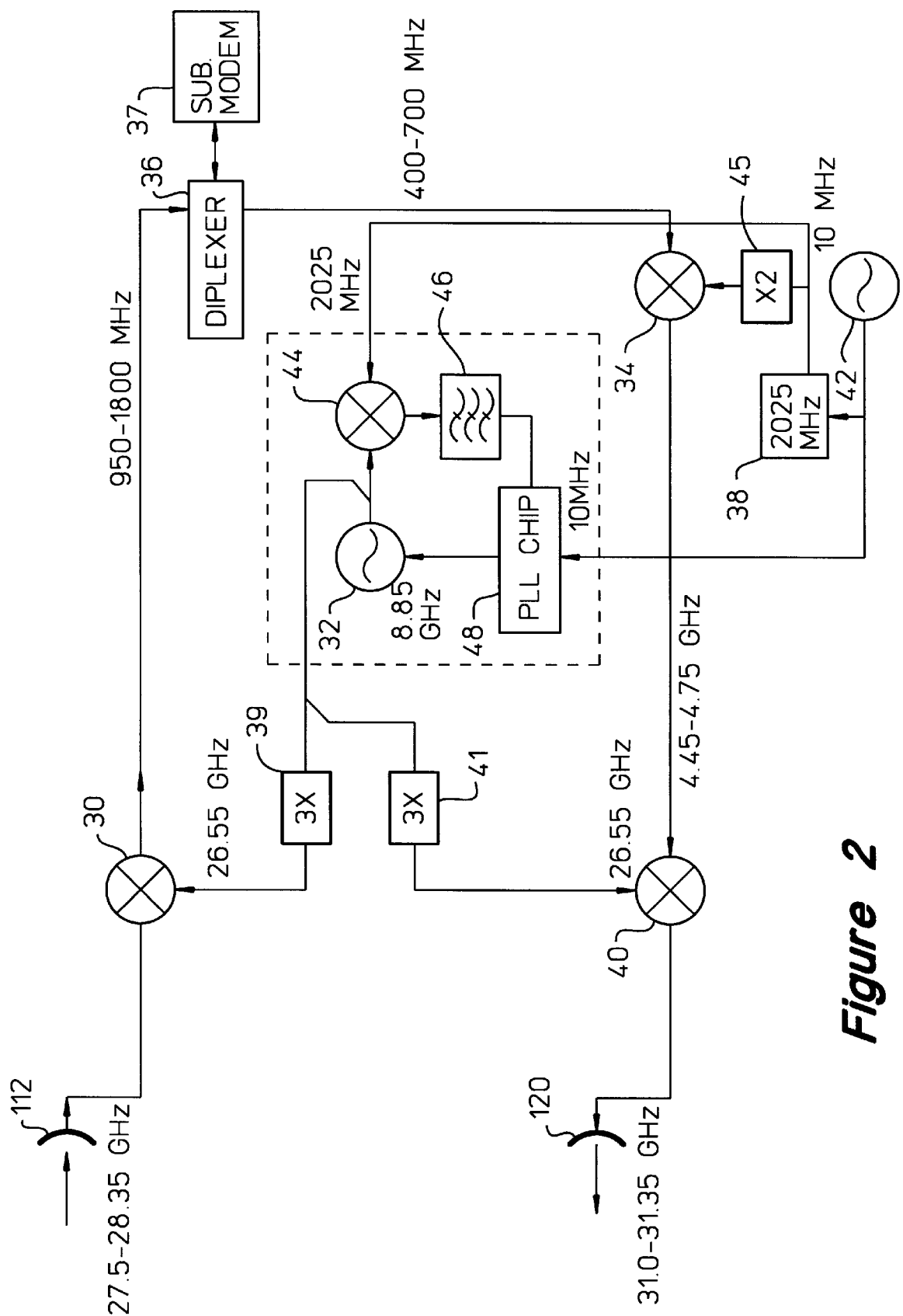
FIG. 2 is a block diagram of an embodiment of the invention.

FIG. 2 shows an embodiment of an LMDS subscriber transceiver unit of this invention. The LMDS subscriber transceiver includes a receiving antenna 112 and a transmit antenna 120. The receiving antenna 112 couples a modulated signal transmitted from an LMDS basestation to the LMDS subscriber unit. The received modulated signal is coupled to an RF input of a receive mixer 30. A transceiver oscillator 32 generates a transceiver drive signal which is coupled to an LO input of the receiving mixer 30. The receiver mixer 30 mixes the received modulated signal with a harmonic of the transceiver drive signal generating a intermediate frequency (IF) received signal. The IF received signal contains the information modulated on the received modulated signal but at a much lower carrier frequency. The IF received signal is coupled through a diplexer 36 to a subscriber modem 37. The subscriber modem 37 demodulates the modulated information of the IF received signal.

The frequency of the modulated signal transmitted from the base station to the subscriber unit is specified by transmission frequency allocations set by the Federal Communications Commission (FCC). For LMDS, the FCC has set the transmission frequency to about 27.5–28.35 Gigahertz (GHz). The subscriber modem 37 is generally a set top box similar to those used for a digital satellite system (DDS). The set top box requires the IF output signal to be between 950 and 1800 Megahertz (MHZ). The embodiment of the invention shown in FIG. 2 includes a times three frequency multiplier 39 between the transceiver oscillator 32 and the receiving mixer 30. The LO input of the mixer should be about 26.55 GHZ. Therefore, the transceiver drive signal driving the times three multiplier 39 must be at a frequency of about 8.85 GHZ.

The LMDS subscriber transceiver also transmits modulated signals to the LMDS base station. The diplexer 36 receives a modulated signal from the subscriber modem 37. The frequency of the modulated signal is based on a standard developed by the digital audio video council (DAVIC). DAVIC has set the frequency range of the modulated signal to between 400 and 700 MHZ. The modulated signal is coupled to an intermediate transmit mixer 34. The intermediate transmit mixer 34 mixes the modulated signal with a harmonic of an intermediate transmit oscillator signal generated by an intermediate transmit oscillator 38. The mixing process of the intermediate translate mixer 34 generates an intermediate transmit signal. The intermediate transmit signal is coupled to a final transmit mixer 40. The final transmit mixer 40 translates the intermediate transmit signal up in frequency by mixing the intermediate transmit signal with a harmonic of the transceiver drive signal to yield an output transmit signal. The output transmit signal is coupled to the base station through the transmit antenna 120.

The frequency of the signals transmitted from the subscriber unit to the base station is specified by the FCC to between about 31.0–31.3 GHz. As was previously described, the transceiver drive signal must be about 8.85 GHZ and the modulated signal must be between 400 and 700 MHZ. The embodiment shown in FIG. 2 includes a second times three multiplier 41 located between the transceiver oscillator 32 and the final transmit mixer 40. Therefore, the intermediate transmit signal must be between 4.45–4.75 GHZ. Alternately, the output of the times three multiplier 39 is connected to the final transmit mixer 40. The embodiment in FIG. 2 also includes a first frequency multiplier 45 connected between the intermediate transmit oscillator 38 and the intermediate transmit mixer 34. Therefore, the intermediate transmit signal must be about 2025 MHZ.

The intermediate transmit oscillator 38 is phase locked to a low frequency stable reference signal generated by a stable source 42. Commercially available phase locked oscillators are available which can operate at the frequency of 2025 MHZ. For example, the VariL SPLL-442 phase locked oscillator operates at 2025 MHZ.

For optimal performance, the transceiver oscillator 32 must be phase locked to the stable reference signal. Integrated circuits for phase locking oscillators are commercially available. These integrated circuits, however, do not operate at frequencies as high as the frequency components of the transceiver drive signal. Therefore, the transceiver drive signal must be divided down or translated down in frequency to allow the transceiver oscillator 32 to be phase locked to the reference source 42 using an inexpensive phase locking integrated circuit chip.

A transceiver drive mixer 44 mixes the transceiver drive signal generated by the transceiver oscillator 32 with a harmonic of the intermediate transmit oscillator signal generated by the intermediate transmit oscillator 38 generating an intermediate phase detect signal. For the embodiment shown in FIG. 2, the transceiver drive mixer 44 is a harmonic mixer in which an odd harmonic of the intermediate transmit oscillator signal is mixed with the transceiver drive signal. Typically, the third or the fifth harmonic of the intermediate transmit signal is mixed with the transceiver drive signal. Mixing the transceiver drive signal with the fifth harmonic generates an intermediate phase detect signal having a frequency of:

(5)*(2.025 GHz)–(8.85 GHz)=1.275 GHz.

The intermediate phase detect signal is coupled to a filter 46 which filters the intermediate phase detect signal.

Alternately, the transceiver drive mixer 44 is not a harmonic mixer and the intermediate transmit signal is frequency quadrupled before being coupled to the transceiver drive mixer 44. Frequency quadrupling of the intermediate transmit signal can be implemented by connecting a frequency doubler from the output of the first frequency multiplier 45 to the transceiver drive mixer 44. Mixing the transceiver drive signal with four times the frequency of the intermediate transmit signal generates an intermediate phase detect signal having a frequency of:

(8.85 GHz)–(2X(2X(2.025 GHz))=0.750 GHz.

Again, the intermediate phase detect signal is coupled to the filter 46 which filters the intermediate phase detect signal.

A phase locked loop (PLL) integrated circuit chip 48 receives the intermediate phase detect signal. The PLL chip 48 also receives the stable low frequency reference signal. The PLL chip 48 divides the frequency of intermediate phase detect signal down to the same frequency as the stable low frequency reference signal. The PLL chip 48 generates an error signal representing the phase difference between the phase of the frequency divided intermediate phase detect signal with the phase of the stable low frequency reference signal. The error signal is coupled to the transceiver oscillator 32 which tunes the transceiver oscillator 26 to minimize the error signal. That is, the error signal generated by the PLL chip 48 tunes the transceiver oscillator 26 up or down in frequency to minimize the phase difference between the intermediate phase detect signal and the stable low frequency reference signal. Therefore, the transceiver oscillator 32 is phase locked to the stable source 42.

Figure 3:
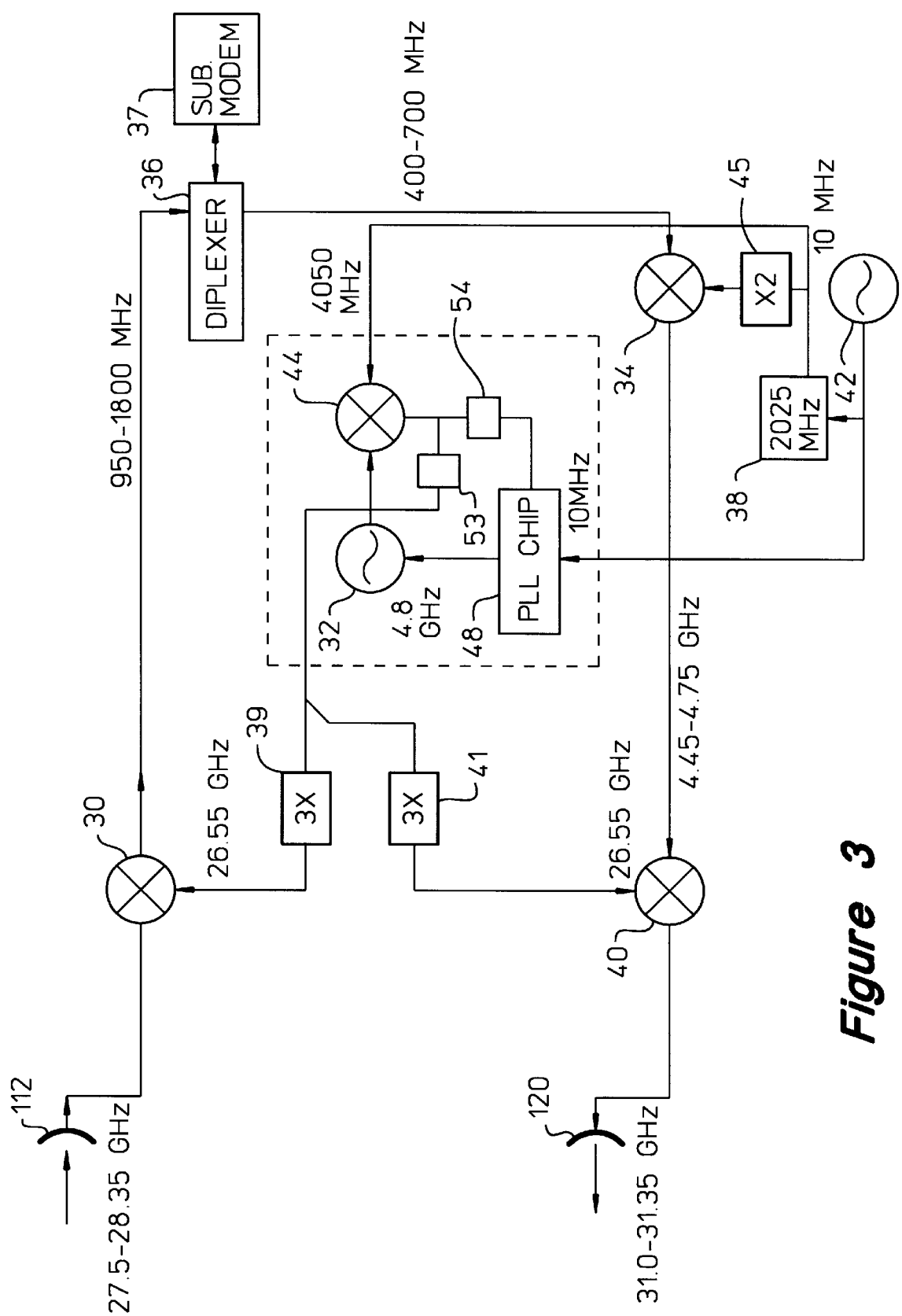
FIG. 3 is a block diagram of another embodiment of the invention.

FIG. 3 shows another embodiment of an LMDS subscriber transceiver of this of invention. This embodiment includes another configuration for phase locking the transceiver oscillator 32.

The transceiver oscillator 32 generates a transceiver oscillator signal which is coupled to the transceiver drive mixer 44. The transceiver drive mixer 44 mixes the output of frequency multiplier 45 with the transceiver oscillator signal generating the transceiver drive signal and the intermediate phase detect signal. A first bandpass filter 53 passes the transceiver drive signal. A second filter 54 passes the intermediate phase detect signal. The PLL chip 48 tunes the frequency the transceiver oscillator 32 to phase lock the transceiver oscillator to the stable source 42.

In the embodiment shown in FIG. 3, the transceiver oscillator 32 operates at 4.8 GHZ. The intermediate transmit oscillator operates at 2025 MHZ. The transceiver drive signal at the output of the first bandpass filter 53 cycles at a frequency of 8.85 GHZ. The intermediate phase detect signal at the output of the second filter 54 cycles at a frequency of 750 MHZ. The intermediate phase detect signal is low enough in frequency that the PLL chip 48 can be used to phase lock the transceiver oscillator 32.

Figure 4:
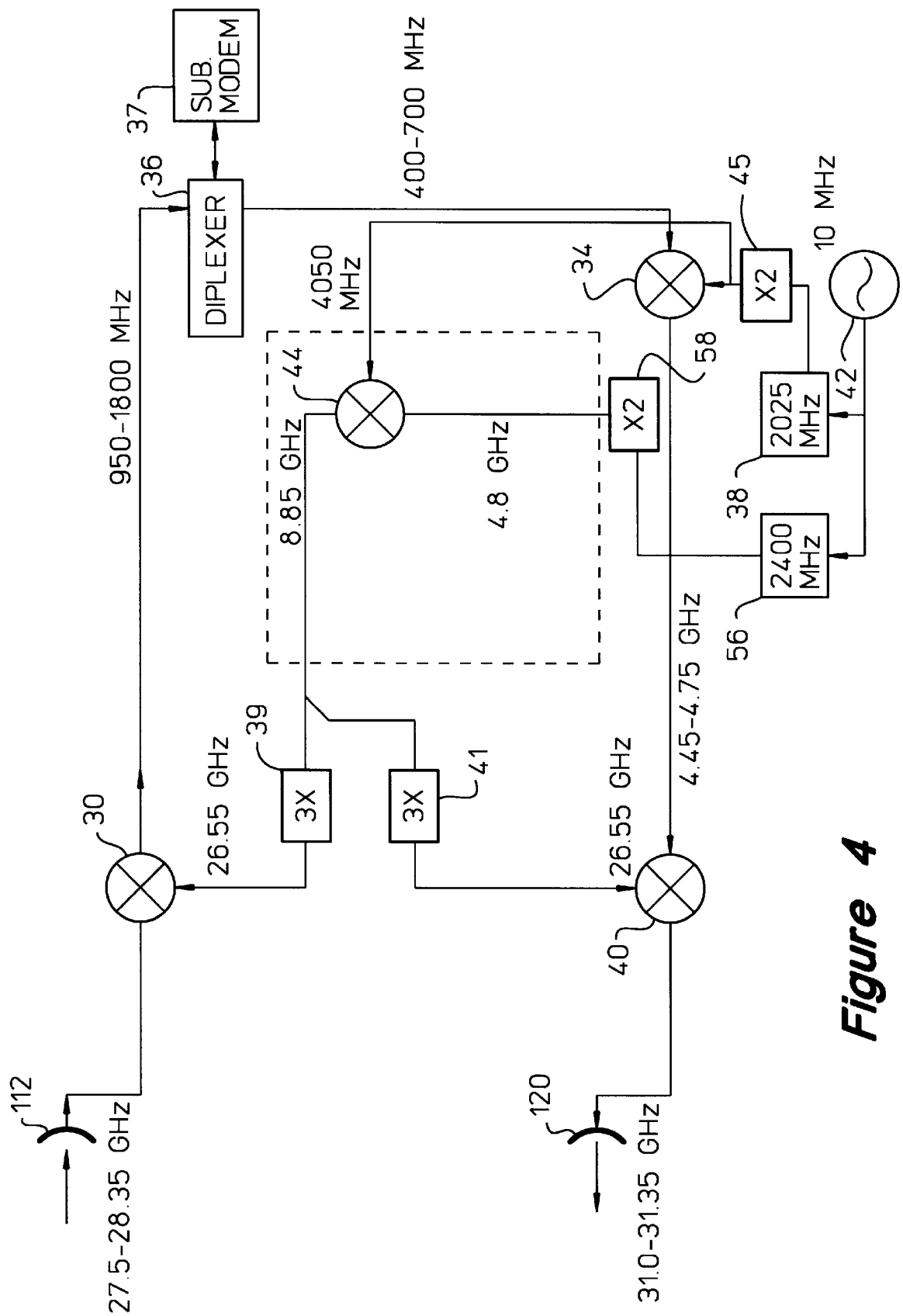
FIG. 4 is a block diagram of another embodiment of the invention.

FIG. 4 shows another embodiment of the invention. This embodiment includes a second frequency multiplier 58 and an intermediate frequency oscillator 56. The intermediate frequency oscillator 56 is phase locked to the stable low frequency reference signal generated by the reference source 42. Like the intermediate transmit oscillator 38, the intermediate frequency oscillator 56 is commercially available. For example, the VariL SPLL-443 phase locked oscillator can operate at 2400 MHZ. The intermediate frequency oscillator 56 generates a second intermediate transmit oscillator signal. The frequency of the second intermediate signal is doubled by the second frequency multiplier 58. The outputs of the first frequency multiplier 45 and the second frequency multiplier 58 are coupled to the transceiver drive mixer 44. The transceiver drive mixer 44 sums the frequency of the signal at the output of the first frequency multiplier 45 with the frequency of the signal at the output of the second frequency multiplier 58 generating the transceiver drive signal.

The embodiment of the invention shown in FIG. 4 includes the intermediate transmit oscillator 38 operating at a frequency of 2025 MHZ and the intermediate frequency oscillator 56 operating at a frequency of 2400 MHZ. Both the intermediate transmit oscillator 38 and the intermediate frequency oscillator 56 are phase locked to the reference source 42.

The signals transmitted between the base station and the subscriber units are modulated signals which are encoded with the information being transferred between the base station and the subscriber units. Many types of complex modulation formats require stable carrier signals in order for the modulated signals to be demodulated with minimal errors. Typically, stable carrier signals are obtained by phase locking the local oscillators of the transceivers to a temperature compensated crystal oscillator. However, temperature compensated crystal oscillators with a frequency stability of less than five parts per million over a useable temperature range are expensive.

As was previously mentioned, the phase noise of the local oscillators is transferred to the modulated signals when the modulated signals are translated up or down in frequency. Furthermore, phase noise is added to the modulated signal during the transmission of the modulated signals.

Figure 5:
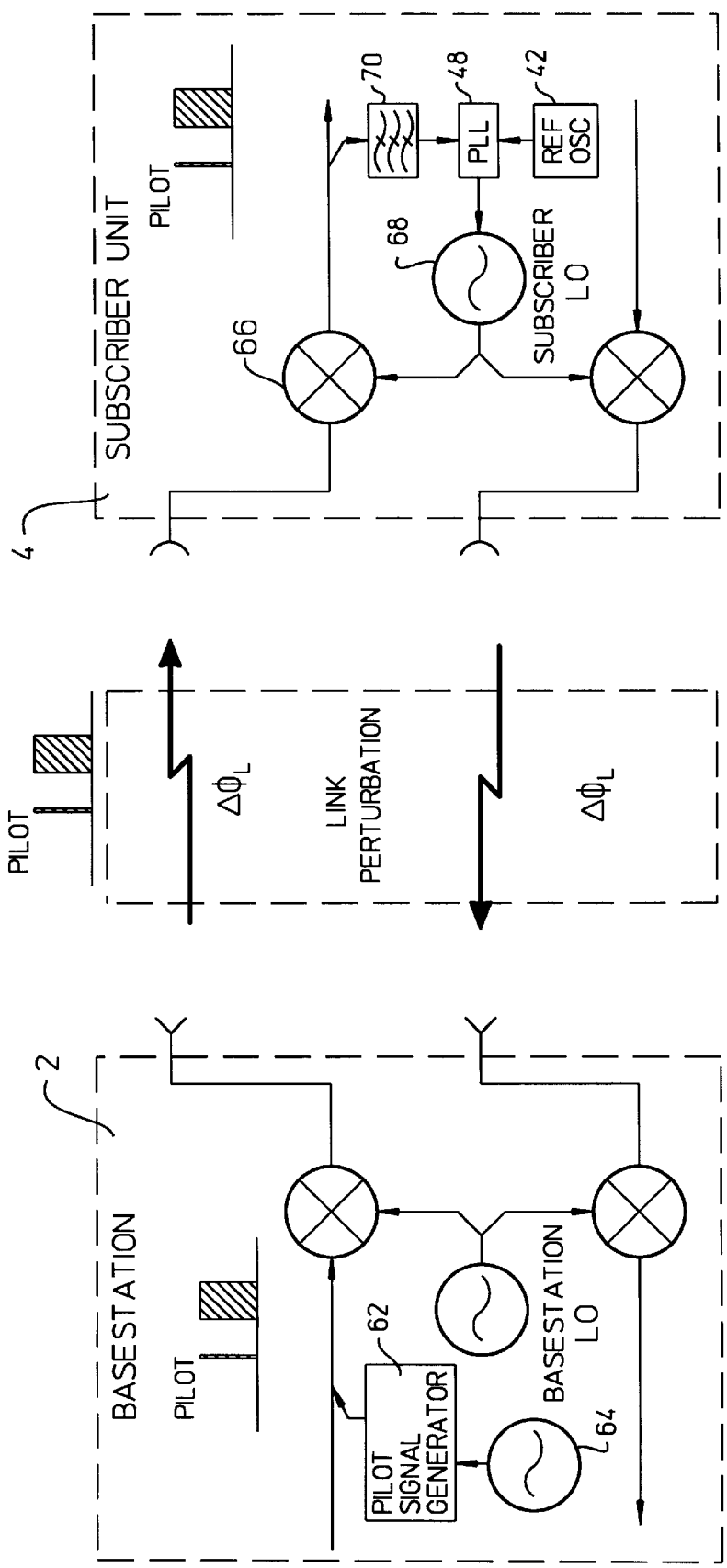
FIG. 5 is an LMDS block diagram showing a single pilot tone reference included within the transmitted signal from the base station.

FIG. 5 shows another embodiment of the invention. This embodiment includes a second low frequency reference oscillator 64 located in the base station transceiver 2. The base station transceiver 2 further includes a pilot signal generator 62. The pilot signal generator 62 generates a pilot signal which is phase locked to the reference signal generated by the second low frequency reference oscillator 64. The pilot signal is coupled onto the modulated signal within the base station 2 before the modulated signal is frequency upconverted and transmitted to the subscriber unit.

The subscriber unit 4 receives the modulated signal and the pilot signal from the base station 2. The subscriber unit 2 includes a receiver mixer 66 and a local oscillator 68. The modulated signal and the pilot signal are frequency down-converted by mixing the modulated signal and the pilot signal with a local oscillator signal generating an intermediate frequency modulated signal. A bandpass filter 70 is coupled to the output of the receiver mixer 66 and filters the intermediate frequency modulated signal. The passband of the bandpass filter 70 is centered at the frequency of the pilot signal. The PLL chip 48 generates an error signal proportional to the phase difference between the pilot signal and the reference oscillator 42. The error signal tunes the local oscillator 66 to minimize the error signal.

As was previously mentioned, phase perturbations can be imposed on the modulated signal during the transmission of the modulated signal from the base station to the subscriber units. The pilot signal is transmitted with the modulated signal. Therefore, any phase perturbations imposed upon the modulated signal are also imposed upon the pilot signal. Because the PLL chip 42 generates the error signal which tunes the local oscillator by detecting the phase difference between the pilot signal and the reference signal, the phase perturbations are also imposed on the local oscillator signal. Because the perturbations are imposed on the local oscillator, the phase perturbations of the modulated signal are reduced by a factor of about sixty.

Figure 6:
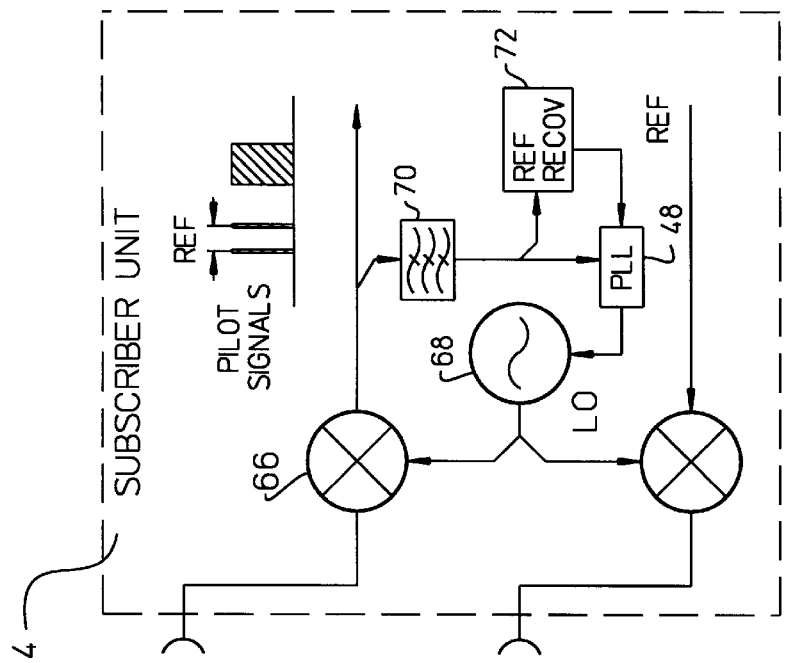
FIG. 6 is an LMDS block diagram showing a dual pilot tone reference included within the transmitted signal from the base station.
Figure 6:
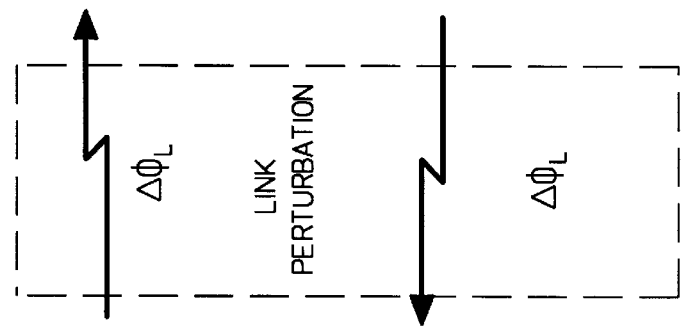
Figure 6:
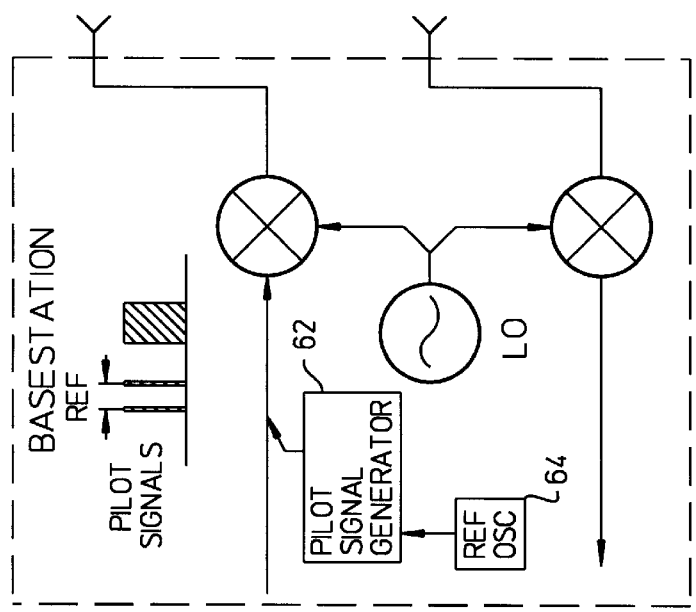

FIG. 6 shows another embodiment of the invention. This embodiment includes the pilot signal generator generating two pilot signals. The two pilot signals are phase locked to the second low frequency reference oscillator 64. The two pilot signals are coupled onto the modulated signal within the base station 2 before the modulated signal is frequency upconverted and transmitted to the subscriber unit 4. The frequency difference between the two pilot tones is a multiple or sub-multiple of the frequency of the second low frequency reference oscillator 64.

The subscriber unit 4 receives the modulated signal and the two pilot signals from the base station 2. The modulated signal and the two pilot signals are frequency downconverted by mixing the modulated signal and the two pilot signals with the local oscillator generating the intermediate frequency modulated signal. The bandpass filter 70 receives the intermediate modulated signal. The passband of the bandpass filter 70 is centered to allow the two pilot signals to pass to the output of the bandpass filter 70.

The output of the bandpass filter is coupled to a reference recovery circuit 72. The reference recovery circuit 72 generates a reference signal by detecting the frequency difference between the two pilot signals. The reference recovery circuitry which includes a non-linear device such as a diode, generates the reference signal having a frequency equal to the difference between the frequencies of the two pilot signals.

The PLL chip 48 generates an error signal proportional to the phase difference between the reference signal generated by the reference recovery circuit 72 and one of the two pilot signals. The phase of the reference signal is not affected by the transmission of the modulated signal between the base station and the subscriber unit. Both of the pilot signals experience the same phase perturbations during the transmission of the signals. Therefore, the difference between the phase and frequency of the two pilot signals remains constant. The error signal, however, is proportional to the phase difference between the reference signal and one of the pilot signal. Therefore, the amplitude of the error signal is affected by the phase perturbations of the pilot signals during transmission. The error signal tunes the local oscillator 68.

As was previously mentioned, the local oscillators within the base station and the subscriber unit also impose phase noise degradation on the modulated signals. The phase noise degradation is also imposed on the pilot tones. Therefore, this degradation also affects the amplitude of the error signal and is corrected.

The subscriber unit local oscillator 68 is phase coherent with the second low frequency reference oscillator 64. Generally, the local oscillator within the base station is phase locked to the second low frequency reference oscillator 64. Therefore, the local oscillators within both the base station 2 and the subscriber unit 4 are phase coherent.

Although specific embodiments of the invention have been described and illustrated, the invention is not to be limited to the specific forms or arrangements of parts so described and illustrated. The invention is limited only by the claims.

What is claimed is:

1. An LMDS transceiver comprising:
   a reference source generating a stable low frequency reference signal;
   a transceiver oscillator generating a transceiver drive signal;
   a receive mixer, the receive mixer mixing a received modulated signal with a harmonic of the transceiver drive signal to generate an intermediate frequency received signal;
   an intermediate transmit oscillator generating an intermediate transmit oscillator signal, the intermediate transmit oscillator being phase locked to the stable low frequency reference signal;
   an intermediate transmit mixer, the intermediate transmit mixer mixing a transmit modulated signal with a harmonic of the intermediate transmit oscillator signal to generate an intermediate transmit signal;
   a final transmit mixer, the final transmit mixer mixing the intermediate transmit signal with a harmonic of the transceiver drive signal to generate an output transmit signal;

a transceiver drive mixer, the transceiver drive mixer mixing the transceiver drive signal with a harmonic of the intermediate transmit oscillator signal to generate an intermediate phase detect signal; and means for phase locking the intermediate phase detect signal with the stable low frequency reference signal.

2. The transceiver as recited in claim 1, wherein the means for phase locking the intermediate phase detect signal with the stable low frequency reference signal comprises:

a phase detector generating an error signal proportional to the phase difference between the intermediate phase detect signal and the stable low frequency reference signal; and means for tuning the transceiver oscillator to minimize the error signal.

3. The transceiver as recited in claim 1, wherein the reference source comprises:

means for recovering dual pilot tones from the intermediate frequency received signal wherein the frequency difference between the dual pilot tones determines the frequency of the stable low frequency reference signal.

4. An LMDS transceiver comprising:

a reference source generating a stable low frequency reference signal;

an intermediate transmit oscillator generating an intermediate transmit oscillator signal, the intermediate transmit oscillator being phase locked to the stable low frequency reference signal;

a transceiver oscillator generating an transceiver oscillator signal;

a transceiver drive mixer, the transceiver drive mixer mixing the transceiver oscillator signal with a harmonic of the intermediate transmit oscillator signal to generate a transceiver drive signal and an intermediate phase detect signal;

an intermediate transmit mixer, the intermediate transmit mixer mixing a transmit modulated signal with a harmonic of the intermediate transmit oscillator signal to generate an intermediate transmit signal;

a final transmit mixer, the final transmit mixer mixing the intermediate transmit signal with a harmonic of the transceiver drive signal to generate an output transmit signal;

a receive mixer, the receive mixer mixing a received signal with a harmonic of the transceiver drive signal to generate an intermediate frequency received signal; and means for phase locking the intermediate phase detect signal with the stable low frequency reference source.

5. The transceiver as recited in claim 4, wherein the means for phase locking the intermediate phase detect signal with the stable low frequency reference signal comprises:

a phase detector generating an error signal proportional to the phase difference between the intermediate phase detect signal and the stable low frequency reference signal; and means for tuning the transceiver oscillator to minimize the error signal.

6. The transceiver as recited in claim 4, wherein the reference source comprises:

means for recovering dual pilot tones from the intermediate frequency received signal wherein the frequency difference between the dual pilot tones determines the frequency of the stable low frequency reference signal.

7. An LMDS transceiver comprising:

a reference source generating a stable low frequency reference signal;

an intermediate transmit oscillator generating a first intermediate oscillator signal, the first intermediate transmit oscillator being phase locked to the stable low frequency reference signal;

an intermediate frequency oscillator generating a second intermediate oscillator signal, the intermediate frequency oscillator being phase locked to the stable low frequency reference signal;

a transceiver drive mixer, the transceiver drive mixer mixing a harmonic of the first intermediate transmit oscillator signal with a harmonic of the second intermediate transmit oscillator to generate a transceiver drive signal;

an intermediate transmit mixer, the intermediate transmit mixer mixing a transmit modulated signal with a harmonic of the first intermediate oscillator signal generating an intermediate transmit signal;

a final transmit mixer, the final transmit mixer mixing the intermediate transmit signal with a harmonic of the transceiver drive signal to generate an output transmit signal; and a receive mixer, the receive mixer mixing a received signal with a harmonic of the transceiver drive signal to generate an intermediate frequency received signal.

8. The transceiver as recited in claim 7, wherein the reference source comprises:

means for recovering dual pilot tones from the intermediate frequency received signal wherein the frequency difference between the dual pilot tones determines the frequency of the stable low frequency reference signal.

9. An LMDS system comprising:

a base station transmitter comprising:
   means for generating a modulated signal;
   a first reference oscillator generating a first reference signal; and
   means for coupling dual pilot tones onto the modulated signal wherein the dual pilot tones are each phase locked to the first reference signal and the frequency difference between the dual pilot tones is a multiple of the frequency of the first reference signal;

a subscriber unit comprising:
   a local oscillator generating a local oscillator signal;
   means for mixing the local oscillator signal with the modulated signal generating an intermediate frequency modulated signal;
   a reference filter for filtering the intermediate frequency modulated signal generating an intermediate reference signal wherein the intermediate reference signal comprises the dual pilot tones;
   means for generating a second reference signal by detecting the frequency difference between the dual pilot tones;
   means for generating an error signal proportional to the phase difference between one of the pilot tones within the intermediate reference signal and the second reference signal; and
   means for tuning the frequency of the local oscillator to minimize the error signal.

* * * * *